US011933830B2

(12) United States Patent
Thibodeau et al.

(10) Patent No.: US 11,933,830 B2
(45) Date of Patent: Mar. 19, 2024

(54) TRAILER LIGHT TESTING SYSTEM

(71) Applicant: GM GLOBAL TECHNOLOGY OPERATIONS LLC, Detroit, MI (US)

(72) Inventors: Harold Bruton Thibodeau, Troy, MI (US); Ansaar Beg, Farmington Hills, MI (US); Andreea Sofia Ungureanu, Washington Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 170 days.

(21) Appl. No.: 17/647,774

(22) Filed: Jan. 12, 2022

(65) Prior Publication Data
US 2023/0221361 A1 Jul. 13, 2023

(51) Int. Cl.
*G01R 31/00* (2006.01)
*B60D 1/62* (2006.01)
*B60Q 1/30* (2006.01)
*G01R 31/58* (2020.01)

(52) U.S. Cl.
CPC ............ *G01R 31/006* (2013.01); *B60D 1/62* (2013.01); *B60Q 1/305* (2013.01); *G01R 31/58* (2020.01)

(58) Field of Classification Search
CPC ........ G01R 31/006; G01R 31/58; B60D 1/62; B60Q 1/305
See application file for complete search history.

(56) References Cited

U.S. PATENT DOCUMENTS

| | | | | |
|---|---|---|---|---|
| 4,812,752 A | * | 3/1989 | Preuss | G01R 31/52 324/519 |
| 5,086,277 A | * | 2/1992 | Hammerly | G01R 31/006 324/504 |
| 2017/0116795 A1 | * | 4/2017 | Andrus | G07C 5/0808 |
| 2018/0238968 A1 | * | 8/2018 | Wada | F02N 11/087 |

OTHER PUBLICATIONS

Research Disclosure. (Jul. 22, 2015). Automated Testing of Trailer Lights. The Industry Standard Disclosure Publication Service. www.researchdisclosure.com. ISN 0374-4353.

* cited by examiner

*Primary Examiner* — Nabil H Syed
*Assistant Examiner* — Cal J Eustaquio
(74) *Attorney, Agent, or Firm* — Lorenz & Kopf LLP

(57) ABSTRACT

An apparatus and methods for testing a trailer light system including a trailer connector for coupling a first voltage to a first trailer light and a second voltage to a second trailer light, a transmission state detector for determining a vehicle transmission state, and a trailer interface module for detecting an electrical connection to a trailer at the trailer connection, and for applying the first voltage to the trailer connector and the second voltage to the trailer connector in response to the detection of the electrical connection and the vehicle transmission state being in a park state.

19 Claims, 5 Drawing Sheets

TRAILER LIGHT TESTING SYSTEM

INTRODUCTION

The present disclosure relates generally to a system for testing trailer lights for use in a trailering application with a motor vehicle. More specifically, aspects of the present disclosure relate to systems, methods and devices for performing trailer light and trailer electrical system tests automatically in response to a new connection to a host vehicle trailer interface.

Pulling a trailer with a tow vehicle has always been and remains a complicated endeavor for many drivers. The ball hitch is typically employed as a trailer connection and provides a joint between the tow vehicle and the trailer. During connection of a trailer to a host vehicle, the trailer is physically connected to the tow vehicle using the ball hitch on the tow vehicle and a receiver or coupler on the trailer. In addition, an electrical connection is made between the tow vehicle and the trailer using an electrical connector attached to the trailer and a socket in the tow vehicle. After the connections are made, an operator must verify the electrical connection between the trailer and the tow vehicle by activating the lights within the vehicle cabin and walking around the trailer to ensure that each light is operative. The operator may employ another person ensure the trailer lights, and more specifically the brake lights, are operative when the tow vehicle brake is depressed. This requirement to start the tow vehicle and continuously move between the tow vehicle cabin and the rear of the trailer is somewhat burdensome to the vehicle operator and may result in some operators not performing the required trailer light checks after connecting the trailer to the tow vehicle. It would be desirable to provide a better trailer light testing option while overcoming the aforementioned problems.

The above information disclosed in this background section is only for enhancement of understanding of the background of the disclosure and therefore it may contain information that does not form the prior art that is already known in this country to a person of ordinary skill in the art.

SUMMARY

Disclosed herein are vehicle electrical system methods and systems and related control logic for provisioning vehicle systems, methods for making and methods for operating such systems, and motor vehicles equipped with onboard control systems. By way of example, and not limitation, there is presented various embodiments of an automatically initiating a trailer light verification test in response to a new electrical connection for trailering in a motor vehicle are disclosed herein.

In accordance with an aspect of the present disclosure an apparatus for testing a trailer light system including a trailer connector for coupling a first voltage to a first trailer light and a second voltage to a second trailer light, a transmission state detector for determining a vehicle transmission state, and a trailer interface module for detecting an electrical connection to a trailer at the trailer connection, and for applying the first voltage to the trailer connector and the second voltage to the trailer connector in response to the detection of the electrical connection and the vehicle transmission state being in a park state.

In accordance with another aspect of the present disclosure wherein the electrical connection is determined in response to a change in current at a connection to the first trailer.

In accordance with another aspect of the present disclosure wherein the electrical connection is determined in response to a change in capacitance at a connection to the first trailer light.

In accordance with another aspect of the present disclosure wherein the trailer interface module is configured to determine a trailer light failure and generate a driver alert in response to an impedance at a connection to the first trailer light.

In accordance with another aspect of the present disclosure wherein the trailer interface module is configured to apply the first voltage for a first duration of time and to apply the second voltage after the first duration of time.

In accordance with another aspect of the present disclosure wherein the vehicle transmission state is determined in response to a transmission shifter location.

In accordance with another aspect of the present disclosure wherein the vehicle transmission state is received from a vehicle controller.

In accordance with another aspect of the present disclosure wherein the electrical connection to a trailer is determined in response to an insertion of a trailer light plug into the trailer connector.

In accordance with another aspect of the present invention, a method of testing a trailer lighting system including detecting a trailer connection, detecting a vehicle transmission park state, and illuminating a first trailer light in response to the detection of the trailer connection and the vehicle transmission park state being in a park condition.

In accordance with another aspect of the present disclosure further including detecting an impedance of an electrical connection to the first trailer light and generating a driver alert in response to the impedance not matching an expected impedance.

In accordance with another aspect of the present disclosure wherein the first trailer light is illuminated for a first duration of time followed by a second trailer light being illuminated after expiration of the first duration of time.

In accordance with another aspect of the present disclosure wherein the trailer connection is determined in response to a change in a current on one or more of a plurality of electrical connections between a towing vehicle and a trailer.

In accordance with another aspect of the present disclosure wherein the trailer connection is determined in response to a change in a capacitance on one or more of a plurality of electrical connections between a towing vehicle and a trailer.

In accordance with another aspect of the present disclosure wherein the trailer connection is determined in response to a change in a voltage on one or more of a plurality of electrical connections between a towing vehicle and a trailer.

In accordance with another aspect of the present disclosure further including illuminating a second trailer light in response to the detection of the trailer connection and the vehicle transmission park state being in a park condition.

In accordance with another aspect of the present disclosure wherein the first trailer light is illuminated following a duration of time greater than five seconds after the detection of the trailer connection.

In accordance with another aspect of the present disclosure wherein the illumination of the first trailer light is discontinued in response to the vehicle transmission park state being changed from the park condition to a non-park condition.

In accordance with another aspect of the present disclosure wherein the illumination of the first trailer light is discontinued in response to detection of a disconnection of the trailer connection.

In accordance with another aspect of the present invention, a trailer interface module including a first output for providing a first voltage to a first trailer light, a second output for providing a second voltage to a second trailer light, a memory for storing a trailer light test algorithm and a trailer light test parameters, an input for detecting a transmission park state, and a processor for detecting a change in a current to at least one of the first output and the second output and for performing the trailer light test algorithm according to the trailer light test parameter and in response to the detection of the change in current and the transmission park state having a park condition.

In accordance with another aspect of the present disclosure wherein the memory is further configured to store an expected impedance and wherein the processor is further configured to determine a detected impedance of the first output and to provide a driver warning in response to the detected impedance not matching the expected impedance.

BRIEF DESCRIPTION OF THE DRAWINGS

The exemplary embodiments will hereinafter be described in conjunction with the following drawing figures, wherein like numerals denote like elements, and wherein.

The exemplifications set out herein illustrate preferred embodiments of the invention, and such exemplifications are not to be construed as limiting the scope of the disclosure in any manner.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description. As used herein, the term module refers to an application specific integrated circuit (ASIC), an electronic circuit, a processor (shared, dedicated, or group) and memory that executes one or more software or firmware programs, a combinational logic circuit, and/or other suitable components that provide the described functionality.

The present application discloses a system and method for activating trailer light outputs automatically upon a new trailer connection. The feature automatically operates the trailer electrical circuits when the system detects a trailer electrical circuits connection. This allows the driver to immediately walk around the trailer to inspect for working or failed trailer lights without the need to re-enter the vehicle to enable the test. The existing trailer light test is inconvenient, complex and may introduce warranty claims. The proposed system and method does not require the user to enter the vehicle after the trailer is connected, reduces the number of involved engine control units (ECU) from four to one. In addition, the method and system may operate when the tow vehicle is off.

Figure 1:
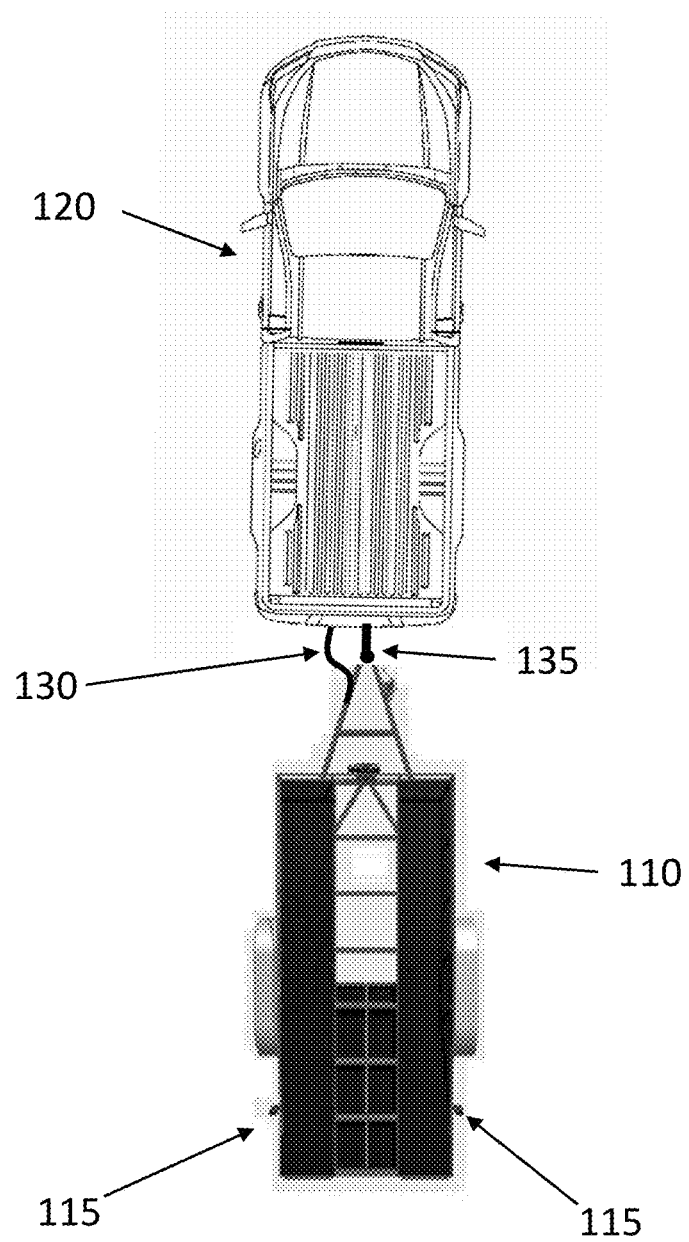
FIG. 1 shows an application for the method and apparatus for the testing of a lighting connection and trailer light operation for trailering in a motor vehicle according to an exemplary embodiment of the present disclosure.

Turning now to FIG. 1, an application for the method and apparatus for the testing of a lighting connection and trailer light operation for trailering in a motor vehicle 100 according to an exemplary embodiment of the present disclosure is shown. The exemplary application shows a towing vehicle 120 and a trailer 110. When connecting the trailer, the towing vehicle operator will position the towing vehicle 120 such that a hitch 135 on the towing vehicle 120 aligns with a receiver on the trailer 110. After the receiver and the hitch 135 are connected, and the receiver is locked onto the hitch 135, the vehicle operator may then connect the trailer plug 130 into a trailer socket in the towing vehicle 120.

The trailer plug 130 and trailer socket may include a 7 pin electrical interface between the towing vehicle 120 and the trailer 110. The 7 electrical connections between the trailer 110 and the towing vehicle 120 may include tail/running lights, auxiliary 12 volt charging, right turn/stop light, left turn/stop light, backup lights, trailer brakes, and ground. The trailer socket may be connected to a trailer interface module within the towing vehicle 120. The trailer interface module may generate electrical signals for coupling to the trailer 110.

In an exemplary embodiment of the trailer light testing method, the method may be initiated by the trailer plug 130 being inserted into the trailer socket on the towing vehicle. The trailer interface module within the towing vehicle 120 may detect the insertion either by a physical switch within the trailer socket or in response to a change in capacitance or resistance on one or more of the 7 electrical connections. Alternatively, a trailer control module within the trailer may generate a signal which may be detected by the trailer interface module within the towing vehicle 120. For example, the trailer interface module may detect a 12 volt DC voltage on the auxiliary 12 volt charging connection and determine that a trailer has been connected.

In response to the determination of a trailer connection, the trailer interface module may then automatically initiate a trailer light test. The trailer light test may be delayed a number of seconds to allow the vehicle operator to get into position to view the trailer lights 115. The trailer lights may be activated one at a time or all simultaneously. For example, the trailer running lights may first be initiated, followed by each turn signal, then the braking lights and reverse lights. Trailer marker lights may also be confirmed, such as being activated with the running lights of the trailer. The vehicle operator may walk around the trailer to confirm the operation of each of the trailer lights. In some exemplary embodiments, unplugging and plugging the trailer plug back into the trailer socket may reinitiate the trailer light test.

Figure 2:
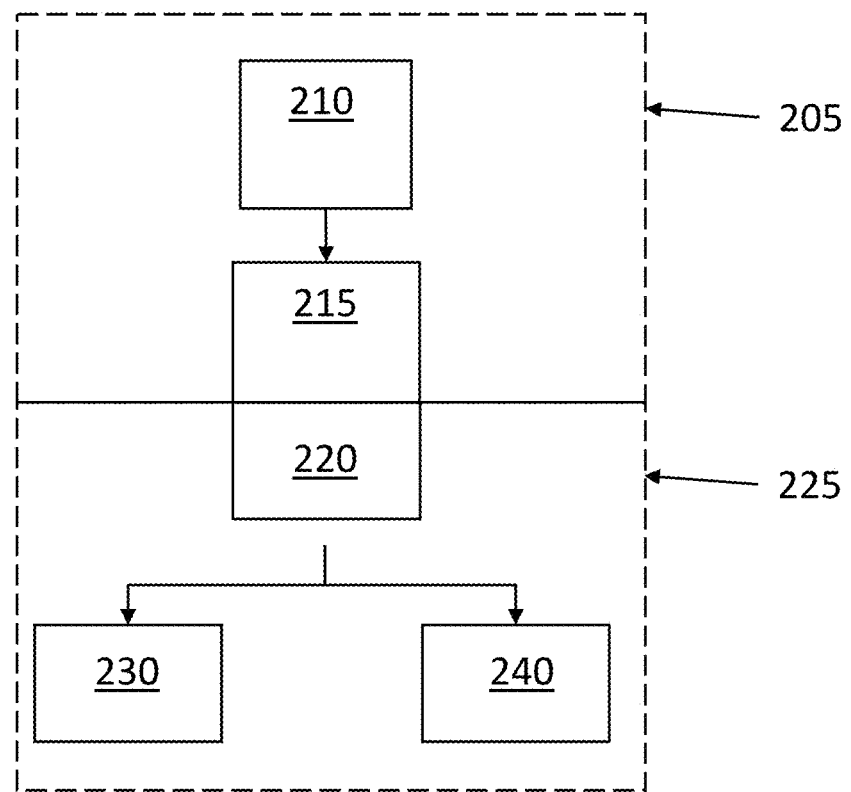
FIG. 2 shows a block diagram illustrating a system for the testing of a lighting connection and trailer light operation for trailering in a motor vehicle according to an exemplary embodiment of the present disclosure.

Turning now to FIG. 2, a block diagram of an exemplary system 200 for the testing of a lighting connection and trailer light operation for trailering in a motor vehicle according to an exemplary embodiment of the present disclosure is shown. The system 200 includes a trailer interface 210 and socket within a towing vehicle 205 and a plug 220, left trailer light 230 and right trailer light 240 in a trailer 225. Although the exemplary embodiment shows only a left trailer light 230 and a right trailer light 240, any number of trailer lights and trailer systems may be tested using the exemplary system and methods.

The socket 215 is typically mounted into a rear bumper of the towing vehicle 205 proximate to the trailer hitch. The socket 215 is electrically coupled to the trailer interface 210 within the towing vehicle 205. The socket 215 may be a 7 pin electrical socket with each of the pins separately electrically coupled to the trailer interface 210. The socket 215 is configured for receiving the plug 220. The plug 220 may be electrically coupled to a wiring system of the trailer 225 with an electrical cord long enough to stay affixed to the socket 215 on the towing vehicle 205 while accommodating the movement of the trailer 225 during towing operations. A first pin of the plug 220 may be electrically coupled to the left trailer light 230 and a second pin of the plug 220 may be electrically coupled to the right trailer light 240.

In some exemplary embodiments, the trailer interface 210 may be configured to detect the insertion of the plug 220 into the socket 215. This detection may be made in response to a change in capacitance or voltage on one or more of the electrical connections to the socket 215. For example, the trailer interface 210 may detect a change in voltage on the ground pin of the socket 215. Alternatively, the insertion may be detected in response to a change of state of a physical switch, such as a button switch being depressed by the plug 220 as the plug 220 is inserted into the socket 215.

In response to the detection of the insertion of the plug 220 into the socket 215, and thus, a connection of a trailer 225 to the towing vehicle 205, the trailer interface 210 may be configured to initiate a trailer light test algorithm. The trailer interface 210 may first energize an electrical connection to a left trailer light 230. The left trailer light 230 may be energized as a solid light or as a blinking light. The left trailer light 230 may be energized after a predetermined delay, such as 5 seconds, to allow a vehicle operator to move from the plug/socket connection to a rear of the trailer 225 in order to view the left trailer light 230. The left trailer light 230 may be energized for a duration of time, such as 5 seconds. After the duration of time for illumination of the left trailer light 230, the right trailer light 240 may then be energized for a duration of time by the trailer interface 210.

In some exemplary embodiments, all of the trailer lights may be illuminated simultaneously by the trailer interface 210 for a duration of time, in response to the detection of the electrical connection between the trailer 225 and the towing vehicle 205. This may allow the vehicle operator to check each light at their own pace to determine operation of each individual light without having to wait until the next light is energized. In some exemplary embodiments, the left trailer light 230 and the right trailer light 240 are each illuminated by separate DC voltages applied in response to control signals generated by the trailer interface 210.

Figure 3:
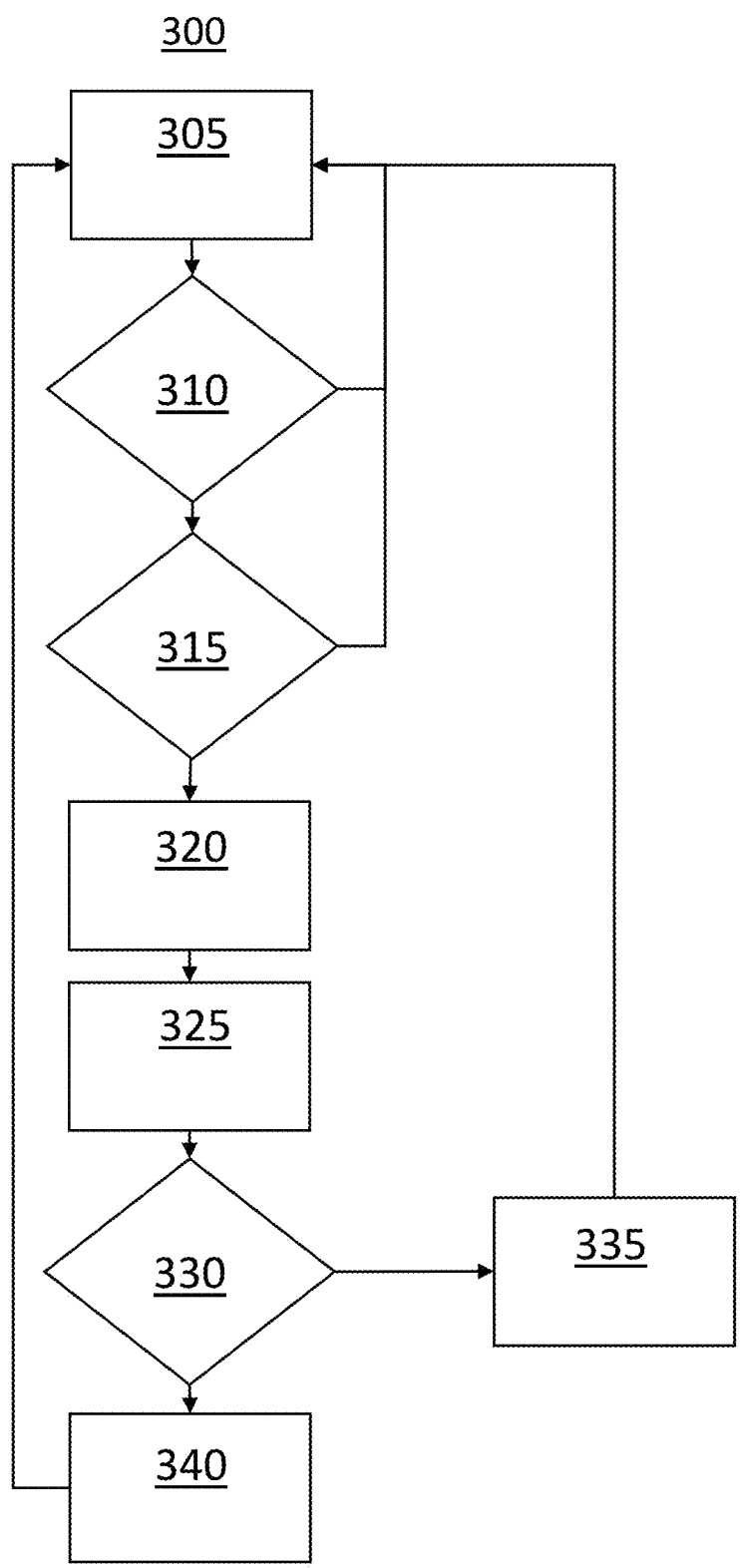
FIG. 3 shows a flow chart illustrating a method for the testing of a lighting connection and trailer light operation for trailering in a motor vehicle according to an exemplary embodiment of the present disclosure.

Turning now to FIG. 3, a flow chart illustrating an exemplary method 300 for the testing of a lighting connection and trailer light operation for trailering in a motor vehicle according to an exemplary embodiment of the present disclosure is shown. In this exemplary embodiment the method is first operative to check 305 for a new trailer connection. The trailer interface module may determine a trailer plug has been connected to the trailer socket on the towing vehicle by periodically monitoring a current flow to the trailer connector. If there is a change in the current, it may be indicative of a new connection. Alternatively, a physical switch, change in capacitance, or other communication from a trailer controller may be used to determine a new connection between a trailer electrical system and a towing vehicle electrical system.

If no new connection has been detected 310, the method returns to periodically checking 305 for a new connection. The method may decrease the time between periodic trailer checks in response to a recently detected new trailer connection and/or a recent failed trailer light test.

If a new connection has been detected 310, the method next determines 315 if the towing vehicle transmission is in a park condition. The park condition is indicative of the vehicle not being in motion or performing an active towing operation. The park condition may be determined in response to a transmission shift lever position, an indication from a vehicle controller, a parking brake state detection sensor, a transmission state sensor or the like. If the transmission is not in a park condition, the method returns to periodically checking 305 for a new connection. A new connection indication while the vehicle is not in park condition, may be indicative of a loose connection between the trailer plug and the trailer connector, or other loose wire in the trailer light system. An indication of the possible fault may then be provided to the vehicle operator, such as an indication on the driver information system or the like.

If the vehicle transmission is in the park condition 315, the method is next operative to retrieve 320 the test parameters for the trailer light test. The trailer interface module may load the test parameters, and/or test algorithm from a memory communicatively coupled to the trailer interface module. The test parameters may include previously stored current levels, expected capacitance, or expected voltage to one or more of the trailer connector pins. The algorithm may include user preferences such as sequentially illuminating each of the trailer lights, simultaneously illuminating the trailer lights, providing an audible alert, such as a horn activation if a fault or failure is detected, haptic feedback such as vibrating seat or steering wheel, or the like.

After the test parameters have been retrieved, the method is next operative to perform 325 the trailer light illumination test according to the test parameters and the test algorithm. The test may be performed by providing an electrical power to each of the trailer light connections either sequentially or simultaneously. The method may continue to apply electrical power to each of the trailer light connections for a duration of time as indicated by the test parameters. For example, each trailer light may be illuminated for 5 seconds allowing the vehicle operator time to visually observe each trailer light.

In some exemplary embodiments, the trailer light illumination test may include detecting an impedance on each of the trailer light electrical connections and comparing that detected impedance against an expected impedance. In response to the comparison, the method determines 330 if the expected impedance is detected. If the expected impedance is not detected, this may be indicative of either an open circuit, a short circuit to ground or a short circuit to the battery or supply voltage. In some exemplary embodiments, the impedance may be determined in response to a current level drawn by the trailer light connection. If the expected impedance is not detected, the method may then determine a trailer light fault and notify 335 a vehicle operator of the fault. The fault notification may be provided by a message or warning light on the towing vehicle instrument panel or information display, an audible warning using a towing vehicle horn, or a flashing of the towing vehicle and/or trailer lights. The method returns to periodically checking 305 for a new connection.

If the expected impedance is detected 330 for the trailer lights, the method may next provide 340 a notification of the passed trailer light test to the vehicle operator. The passed trailer light test may be indicated by a message on a driver information system within the vehicle, an audible confirmation using a towing vehicle horn, or a flashing of the towing vehicle and/or trailer lights. The method may then return to periodically checking 305 for a new connection.

Figure 4:
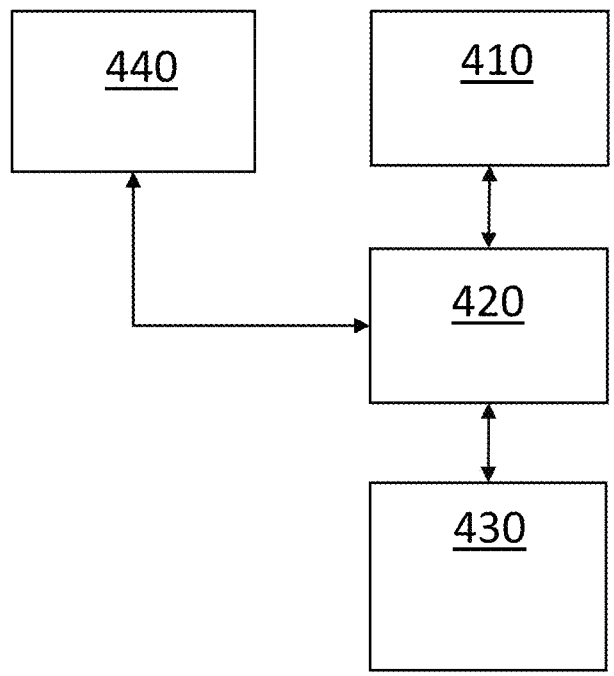
FIG. 4 shows a block diagram illustrating a system for the testing of a lighting connection and trailer light operation for trailering in a motor vehicle according to another exemplary embodiment of the present disclosure.

Turning now to FIG. 4, a block diagram of a system for the testing of a lighting connection and trailer light operation for trailering in a motor vehicle 400 according to an exemplary embodiment of the present disclosure is shown. The system 400 may include a trailer connection 410, a trailer interface module 420, a transmission state detector 430 and a memory 440.

The trailer connection 410 may be configured for providing an electrical connection between a towing vehicle electrical system and a trailer electrical system. In some exemplary embodiments, the trailer connector 410 is a seven pin trailer connector socket mounted to the rear of a towing vehicle. The trailer connector 410 may be configured for separately providing an electrical power to a plurality of individual trailer lights, such as turn signals and brake lights, or may provide control signals to a trailer light control module located within the trailer. In some exemplary embodiments, the trailer connector may be operative for coupling a first voltage to a first trailer light and a second voltage to a second trailer light.

The transmission state detector 430 is operative for determining a vehicle transmission state and for providing the transmission state to the trailer interface module 420. The transmission state detector 430 may determine a position of a transmission shift lever. Alternatively, the transmission state detector 430 may be a vehicle controller operative to receive an indicator signal from a vehicle transmission or other vehicle control module.

The trailer interface module 420 may be configured for detecting an electrical connection to a trailer at the trailer connection, and for applying the first voltage to the trailer connector and the second voltage to the trailer connector in response to the detection of the electrical connection and the vehicle transmission state being in a park state. In some exemplary embodiments, the electrical connection may be determined in response to a change in current at a connection to the first trailer. For example, an application of a voltage at an electrical connector within the trailer connector may have zero amps for an open circuit, but greater than zero amps when a trailer light or other trailer system is coupled to the electrical connector. Alternatively, the electrical connection may be determined in response to a change in capacitance at a connection to the first trailer light or in response to a depression of a physical switch or activation of a physical switch within the trailer connection 410. The trailer interface module 420 may be configured to apply the first voltage for a first duration of time and to apply the second voltage after the first duration of time such that the first trailer light and the second trailer light are illuminated sequentially. Alternatively, the trailer interface module 420 may be configured to apply the first voltage and the second voltage simultaneously during the first duration of time such that the first trailer light and the second trailer light are illuminated concurrently.

The trailer interface module 420 may be configured to determine a trailer light failure and generate a driver alert in response to the determined trailer light failure. The trailer light failure may be determined in response to an impedance at a connection to the first trailer light. For example, if the connection to the trailer has a very high impedance, such as several mega-ohms, the trailer interface module 420 may determine that an open circuit condition exists and generate the driver alert. Likewise, if a very low impedance is detected, such as less than one ohm, the trailer interface module 420 may determine a short circuit condition exists and generate the driver alert.

In some exemplary embodiments, the system 400 may be a trailer interface module including a first output for providing a first voltage to a first trailer light and a second output for providing a second voltage to a second trailer light. The trailer interface module may further include a processor for detecting a change in a current to at least one of the first output and the second output and for performing the trailer light test algorithm according to the trailer light test parameter and in response to the detection of the change in current and the transmission park state having a park condition.

The trailer interface module may be communicatively coupled to a memory for storing a trailer light test algorithm and trailer light test parameters and an input for detecting a transmission park state. In some exemplary embodiments, the memory may be configured to store an expected impedance and wherein the processor is further configured to determine a detected impedance of the first output and to provide a driver warning in response to the detected impedance not matching the expected impedance.

Figure 5:
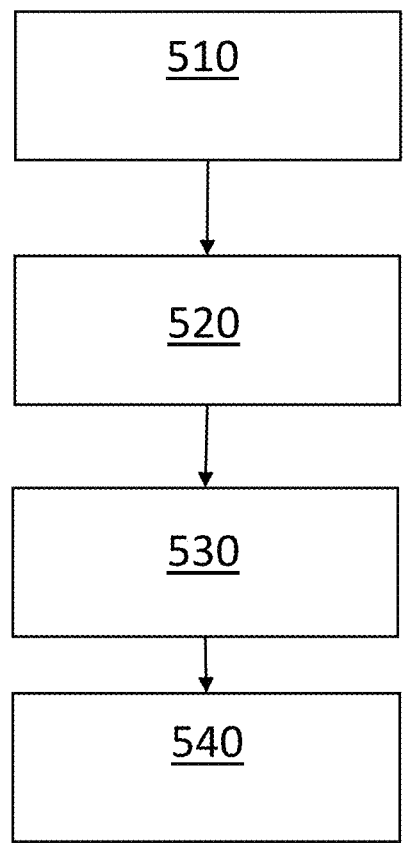
FIG. 5 shows a flow chart illustrating a method for the testing of a lighting connection and trailer light operation for trailering in a motor vehicle according to another exemplary embodiment of the present disclosure.

Turning now to FIG. 5, a flow chart illustrating another exemplary method for the testing of a lighting connection and trailer light operation for trailering in a motor vehicle 500 according to an exemplary embodiment of the present disclosure is shown. The method is first operative for detecting 510 a trailer connection. The trailer connection may be determined in response to a change in a current on one or more of a plurality of electrical connections between a towing vehicle and a trailer. Alternatively, the trailer connection may be determined in response to a change in a capacitance on one or more of a plurality of electrical connections between a towing vehicle and a trailer. In some exemplary embodiments, the trailer connection may be determined in response to a change in a voltage on one or more of a plurality of electrical connections between a towing vehicle and a trailer.

The method is next operative for detecting 520 a vehicle transmission park state. The park condition is indicative of the vehicle not being in motion or performing an active towing operation. The park condition may be determined in response to a transmission shift lever position, an indication from a vehicle controller, a parking brake state detection sensor, a transmission state sensor or in response to a vehicle controller detection of a host vehicle speed exceeding a threshold speed, such as five miles per hour. If the transmission park state is not in the park condition, this may indicate that the vehicle is in motion and that it is undesirable to perform the trailer light test at that time.

The method next illuminates 530 a first trailer light in response to the detection of the trailer connection and the vehicle transmission park state being in a park condition. For example, the first trailer light may be illuminated following a duration of time greater than five seconds after the detection of the trailer connection. The illumination of the first trailer light may be discontinued in response to the vehicle transmission park state being changed from the park condition to a non-park condition or in response to detection of a disconnection of the trailer connection.

In addition, a second trailer light may be illuminated in response to the detection of the trailer connection and the vehicle transmission park state being in a park condition. The second trailer light may be illuminated simultaneously with the first trailer light or sequentially with the first trailer light. The order and duration of the illumination of the trailer lights may be performed in response to a user preference as determined in response to a user input on a user input device or other connected device for receiving a user input. In some exemplary embodiments, the first trailer light is illuminated for a first duration of time followed by a second trailer light being illuminated after expiration of the first duration of time.

In some exemplary embodiments, the method may detect 540 an impedance of an electrical connection to the first trailer light and generate a driver alert in response to the impedance not matching an expected impedance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. An apparatus for testing a trailer light system comprising:
   a trailer connector for coupling a first voltage to a first trailer light and a second voltage to a second trailer light;
   a transmission state detector for determining a vehicle transmission state; and
   a trailer interface module for detecting an electrical connection to a trailer at the trailer connector, and for initiating a trailer light test algorithm and applying the first voltage to the trailer connector and the second voltage to the trailer connector in response to the detection of the electrical connection and the vehicle transmission state being in a park state and discontinuing the trailer light test algorithm and applying the first voltage to the trailer connector and the second voltage to the trailer connector in response to the vehicle transmission state not being in the park state wherein the first trailer light is illuminated in response to the first voltage following a duration of time greater than five seconds after the detection of the trailer connection.

2. The apparatus of claim 1 wherein the electrical connection is determined in response to a change in current at a connection to the first trailer light.

3. The apparatus of claim 1 wherein the electrical connection is determined in response to a change in capacitance at a connection to the first trailer light.

4. The apparatus of claim 1 wherein the trailer interface module is configured to determine a trailer light failure and generate a driver alert in response to an impedance at a connection to the first trailer light.

5. The apparatus of claim 1 wherein the trailer interface module is configured to apply the first voltage for a first duration of time and to apply the second voltage after the first duration of time.

6. The apparatus of claim 1 wherein the vehicle transmission state is determined in response to a transmission shifter location.

7. The apparatus of claim 1 wherein the vehicle transmission state is received from a vehicle controller.

8. The apparatus of claim 1 wherein the electrical connection to the trailer is determined in response to an insertion of a trailer light plug into the trailer connector.

9. An apparatus for testing a trailer light system comprising:
   a trailer connector for coupling a first voltage to a first trailer light and a second voltage to a second trailer light;
   a transmission state detector for determining a vehicle transmission state; and
   a trailer interface module for detecting an electrical connection to a trailer at the trailer connector, and for initiating a trailer light test algorithm and applying the first voltage to the trailer connector and the second voltage to the trailer connector in response to the detection of the electrical connection and the vehicle transmission state being in a park state and discontinuing the trailer light test algorithm and applying the first voltage to the trailer connector and the second voltage to the trailer connector in response to the vehicle transmission state not being in the park state wherein the first trailer light is illuminated in response to the first voltage following a duration of time greater than five seconds after the detection of the trailer connection.

10. The method of claim 9 further including detecting an impedance of an electrical connection to the first trailer light and generating a driver alert in response to the impedance not matching an expected impedance.

11. The method of claim 9 wherein the first trailer light is illuminated for a first duration of time followed by the second trailer light being illuminated after expiration of the first duration of time.

12. The method of claim 9 wherein the trailer connection is determined in response to a change in a current on one or more of a plurality of electrical connections between a towing vehicle and a trailer.

13. The method of claim 9 wherein the trailer connection is determined in response to a change in a capacitance on one or more of a plurality of electrical connections between a towing vehicle and a trailer.

14. The method of claim 9 wherein the trailer connection is determined in response to a change in a voltage on one or more of a plurality of electrical connections between a towing vehicle and a trailer.

15. The method of claim 9 further including illuminating the second trailer light in response to the detection of the trailer connection and the vehicle transmission park state being in the park condition and a discontinuing of the illumination of the first trailer light.

16. The method of claim 9 wherein the illumination of the first trailer light is discontinued in response to the trailer light test algorithm.

17. The method of claim 9 wherein the illumination of the first trailer light is discontinued in response to detection of a disconnection of the trailer connection.

18. A trailer interface module comprising:
   a first output for providing a first voltage to a first trailer light;
   a second output for providing a second voltage to a second trailer light;
   a memory for storing a trailer light test algorithm and a trailer light test parameter;
   an input for detecting a transmission park state; and a processor for detecting a change in a current to at least one of the first output and the second output and for performing the trailer light test algorithm according to the trailer light test parameter and in response to the detection of the change in the current and the transmission park state having a park condition and for discontinuing the trailer light test algorithm in response to the transmission park state having a non-park condition and wherein the first trailer light is illuminated in response to the first voltage following a duration of time greater than five seconds after the detection of the change in current to at least one of the first output and the second output.

19. The trailer interface module of claim 18 wherein the memory is further configured to store an expected impedance and wherein the processor is further configured to determine a detected impedance of the first output and to provide a driver warning in response to the detected impedance not matching the expected impedance.

\* \* \* \* \*